March 13, 1962 R. E. ANDERSON 3,025,439
MOUNTING FOR SILICON SEMICONDUCTOR DEVICE
Filed Sept. 22, 1960

INVENTOR
Robert E. Anderson
BY Stevens, Davis, Miller & Mosher
ATTORNEYS

United States Patent Office 3,025,439

Patented Mar. 13, 1962

3,025,439

MOUNTING FOR SILICON SEMICONDUCTOR DEVICE

Robert E. Anderson, Dallas, Tex., assignor to Texas Instruments Incorporated, Dallas, Tex., a corporation of Delaware Filed Sept. 22, 1960, Ser. No. 57,702

3 Claims. (Cl. 317—240)

Figure 1:
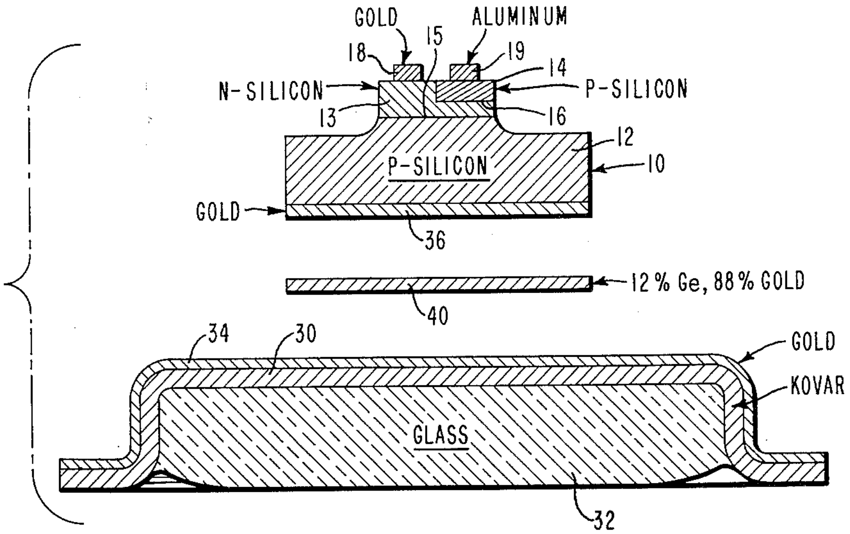

The present invention relates to a method for mounting a silicon semiconductor device onto a header and to a mounting for a silicon semiconductor device that enables the device to be stored and operated at temperatures in excess of 300° C.

In the art of fabricating semiconductor devices, and especially silicon semiconductor devices, one of the principal problems concerns controlling the fabrication steps and materials used so the final device can be stored and will be operable at the highest possible temperatures. In this regard, the semiconductor material itself sets the ultimate limit upon the temperature of storage and operation of the final device. The other materials which are used during fabrication for leads, contacts, solders, etc. usually have the effect of lowering the permissible temperature of operation of the final device below that which is theoretically possible for the particular semiconductor material. Assuming, for example, that a transistor device is to be fabricated, contacts must be attached to the emitter, base and collector regions of the transistor. The materials which are used to make the contacts are usually selected in such fashion as not to impose any limitation on the storage and the operating temperature of the packaged device. Oftentimes, it is not feasible to satisfy just this condition and a less desirable material, from this standpoint, is selected for reasons of less power dissipation, greater mechanical strength, or some other valid reason. In devices which are currently in use and in production, one of the most troublesome areas as regards limiting the temperature of storage and operation is in the mounting or attachment of the device onto a header. This is particularly so in dealing with silicon semiconductor devices and, especially, silicon transistors.

It is conventional practice to mount a silicon semiconductor device directly onto a header. This latter member is composed of an eyelet of metal which is filled with a glass which matches the thermal growth properties of the eyelet. Usually, the transistor is in the form of a wafer, one surface of which constitutes the exposure of the collector region. The opposite face of the wafer embodies the base and emitter regions of the transistor and their contacts. One particular structure of this type is known in the art as a mesa transistor. This unit has exceptional utility in high-frequency applications as the PN junctions are all of very small cross-sectional area.

The transistor, as described in the foregoing paragraph, is mounted onto the header by placing collector side down, and attaching by some means to the header. There are many ways of doing this according to the prior art. One simple way is to use a solder that will bond with the metal of the header and the collector region of the transistor. Indium and tin solders have been useful for this purpose. The main drawback with mounting the transistor onto the header in this fashion stems from the limitations that are imposed upon the storage and operating temperature of the device. Since the solders are necessarily low-melting alloys, they limit the temperature of operation of the device to that temperature at which the solders remain in their solid state. This also applies to the contacts made to the emitter and base regions, as well as wires which are alloyed or soldered to these contacts. In all cases, there is always the possibility that the fullest advantages of the semiconductor device may not be realized due to the limitations imposed by the selection of a particular material.

It is this problem that the present invention seeks to overcome with special reference to the attachment between the semiconductor device and the header. By virtue of the present invention, it has been discovered that this particular attachment or mounting can be effected in an efficient and expedient manner. In short, the method of the present invention provides for mounting a silicon semiconductor device onto a header to obtain the highest possible storage and operating temperatures.

It is accordingly an object of the present invention to provide a unique method for mounting a silicon semiconductor device onto a header which will enable the resulting product to be stored and operated at the highest possible temperature.

It is a further object of the present invention to provide a novel structure comprised of a silicon semiconductor device mounted onto a header in such a structural relationship that the highest possible storage and operating temperatures can be realized.

It is a still further object of the present invention to provide a method for mounting a silicon semiconductor device onto a header in an expedient, efficient, and economical way that lends itself readily to mass production techniques.

Other and further objects of the present invention will become readily apparent from the following detailed description of a single preferred embodiment of the present invention.

Figure 2:
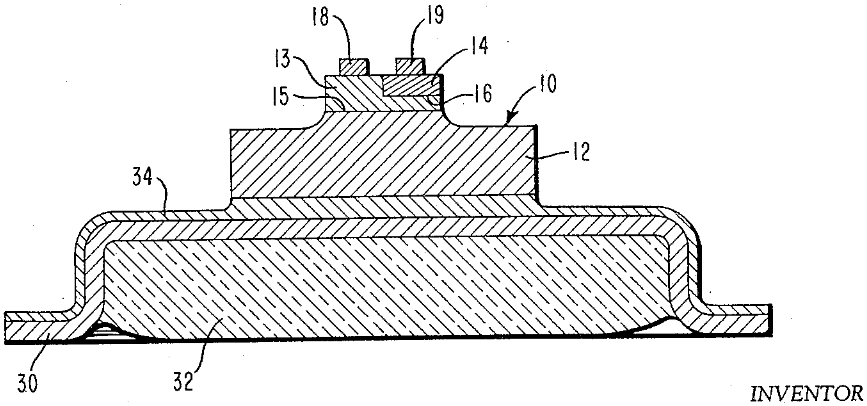

Referring to the drawings:

FIGURE 1 is an exploded view showing a silicon semiconductor device, a preform and a header; and FIGURE 2 is a view in section through a mounted semi-conductor device illustrating the structural relationship of the parts.

Referring now in detail to the drawings, the present invention will be described with reference to a specific preferred embodiment, and will set forth the best mode for carrying out the invention. It is to be understood, however, that although the ensuing description particularly refers to the attachment of a PNP silicon transistor onto a header, it is not so limited and other alternative arrangements may be employed. The essence of the present invention is the manner of attachment of a silicon semiconductor device onto a header and not the attachment of a specific type of transistor device to a header.

Referring to FIGURE 1, the essential parts employed in the method are shown in exploded form. Numeral 10 designates generally a silicon transistor device comprised of a P-type collector region 12, an N-type diffused base region 13, and a P-type diffused emitter region 14. A PN junction 15 is formed between the base and collector regions, and similarly, a PN junction 16 is formed between the emitter and base regions.

Contacts are alloyed to the base region 13 and the emitter region 14 by evaporating metal strips 18 and 19, respectively, onto these regions. The base contact may, for example, be comprised of gold, and the emitter contact may, for example, be comprised of aluminum.

Also shown in FIGURE 1 is a conventional header comprised of a Kovar eyelet 30 filled with a suitable glass 32. Kovar is the commercial name of an iron-nickel-cobalt alloy, and is designed to match the thermal characteristics with a hard glass identified in the trade as Corning Glass No. 7052. Kovar and the glass make an excellent metal-to-glass seal. As is customary, leads are embedded in the glass and project through the Kovar eyelet. For purposes of simplicity, the leads have been omitted from the portrayal of FIGURE 1, as they constitute no part of the present invention. It will be recognized, however, that at least two leads project through the Kovar in an electrically insulating fashion, and these two leads are utilized to make electrical connection with the emitter contact 19 and the base contact 18.

Explaining now the method of the present invention, a gold coating 34 is placed on the outside surface of the Kovar eyelet 30 in the manner shown in FIGURE 1. This gold coating 34 may be applied in any conventional fashion, as by evaporating or by electroplating. In any event, great care is taken to ensure that the resulting gold coating 34 is deposited with great purity. A gold coating 36 is applied to the exposed face of the collector region 12 also by any conventional technique. It is preferred, however, that this coating be applied to the face of the collector region 12 by using the hot substrate method. This method consists essentially of heating the wafer to a suitable alloying temperature and thereafter evaporating the gold onto the substrate to form the layer 36. The net result of the technique is that the gold alloys with the face of the collector region 12. The method to accomplish this is conventional in all respects, and well known in the art.

Interposed between the transistor 10 and the header is a preform approximately 2 mils thick. This preform is comprised of an alloy consisting of about 12% germanium and about 88% gold. The preform, identified in FIGURE 1 by the reference numeral 40, is about the same diameter as the face of the transistor 10. In order to complete the mounting of the transistor 10 onto the header, the following procedure is carried out. The header is mounted in a suitable furnace, and the preform 40 is placed onto the gold coating 34. Thereafter, the transistor 10 is placed onto the preform 40 with the gold coating 36 registering with and in intimate contact with the preform 40. With the various parts stacked in this fashion, the temperature is raised to about 356° C. at which point alloying occurs. As a result of this heating, the transistor 10 is alloyed to the Kovar header through the intermediary of the gold coatings 34 and 36 and the preform 40. The resulting product is illustrated in FIGURE 2 wherein it will be noted that the gold coatings 34 and 36 and preform 40 have been completely merged and lost their identity. The result is one substantially continuous gold connection or contact formed between the Kovar 30 and the face of the collector region 12.

As a result of the practice of the method of this invention, the structure, as illustrated in FIGURE 2, is obtained. This structural configuration is capable of being stored at temperatures in excess of 300° C. without danger of failure of the contacts or of the attachment of the header. A further advantage of the present invention stems from the fact that no flux is required to accomplish the alloying step previously described.

Although the present invention has been shown and described with reference to a single preferred embodiment and to the best mode for carrying out the invention, it will nevertheless be appreciated that various modifications and changes can be made which do not in fact depart from the teachings and concepts of the invention. Such changes as are obvious to one skilled in the art from a knowledge of this invention are deemed to come within the purview of the present invention.

What is claimed is:

1. The method of mounting a silicon semiconductor device onto a header that comprises the steps of coating a portion of the silicon semiconductor device and header with gold, stacking the gold coatings through the intermediary of a preform consisting of 12% germanium and 88% gold and, thereafter, raising the temperature of the resultant stack to about 356° to effect alloying of the gold.

2. A semiconductor structure comprising a header composed of a metal eyelet filled with glass and characterized by a gold coating on the face of the metal eyelet, a silicon semiconductor device including a gold coating on one region thereof, and a layer consisting of about 12% germanium and about 88% gold alloyed to both of said gold layers to hold the silicon semiconductor device onto the header.

3. A semiconductor structure comprising a silicon semiconductor device, a support therefor, a gold coating on each of said device and said support, and a layer consisting of about 12% germanium and about 88% gold alloyed to said gold layers thereby attaching said device to said support.

References Cited in the file of this patent

UNITED STATES PATENTS

| | | |
|---|---|---|
| 2,757,324 | Pearson | July 31, 1956 |
| 2,813,326 | Liebowitz | Nov. 19, 1957 |
| 2,836,878 | Shepard | June 3, 1958 |
| 2,856,681 | Lacy | Oct. 21, 1958 |
| 2,906,930 | Raithel | Sept. 29, 1959 |
| 2,917,684 | Becherer | Dec. 15, 1959 |
| 2,929,137 | Jones | Mar. 22, 1960 |
| 2,964,830 | Henkels et al. | Dec. 20, 1960 |